(12) United States Patent
Yamashita

(10) Patent No.: US 6,857,523 B1
(45) Date of Patent: Feb. 22, 2005

(54) METHOD AND APPARATUS FOR REDUCING CONTAMINATION IN A PLASTIC CONTAINER

(76) Inventor: Seiji Yamashita, 12700 SE. Forest St., Vancouver, WA (US) 98683

( * ) Notice: Subject to any disclaimer, the term of this patent is extended or adjusted under 35 U.S.C. 154(b) by 0 days.

(21) Appl. No.: 09/507,212

(22) Filed: Feb. 18, 2000

(51) Int. Cl.⁷ ........................... B65D 85/00; B65D 85/86
(52) U.S. Cl. ................. 206/524.3; 206/204; 206/524.6; 206/525
(58) Field of Search ...................... 422/186.3; 428/607, 428/35.7; 206/204, 524.3, 524.6, 525

(56) References Cited

U.S. PATENT DOCUMENTS

| | | | | |
|---|---|---|---|---|
| 4,686,152 A | * | 8/1987 | Matsubayashi et al. ..... | 428/607 |
| 5,562,820 A | * | 10/1996 | Taoda et al. ................... | 210/94 |
| 5,573,819 A | * | 11/1996 | Nugent, Jr. et al. ......... | 428/34.8 |
| 5,575,394 A | * | 11/1996 | Nyseth ......................... | 206/710 |
| 6,235,358 B1 | * | 5/2001 | Goto et al. ................. | 428/35.7 |
| 6,395,240 B1 | * | 5/2002 | Fujii et al. ................ | 422/186.3 |

OTHER PUBLICATIONS

"Photocatalysts . . . ?", Date unknown.

* cited by examiner

Primary Examiner—James J. Seidleck
Assistant Examiner—Thao Tran
(74) Attorney, Agent, or Firm—Birdwell & Janke, LLP

(57) ABSTRACT

A method and apparatus for reducing contamination in a plastic container. A coating is provided for the container serving two functions. First, it causes the surface of the container to wet more easily. Second, it reacts with organic molecules emitted from the container so as to render them harmless to the contents stored inside the container.

6 Claims, 1 Drawing Sheet

METHOD AND APPARATUS FOR REDUCING CONTAMINATION IN A PLASTIC CONTAINER

BACKGROUND OF THE INVENTION

The present invention relates to a method and apparatus for reducing contamination in a plastic container, particular such a container that is employed for transporting semiconductor wafers in a semiconductor device manufacturing facility.

The ever present need to reduce particulate contamination in semiconductor device fabrication is well known. Within the clean room, semiconductor wafers are often transported between fabrication operations in closed, plastic containers. As the clean room is not completely devoid of particles, the containers assist in preventing some particles from reaching the wafers. However, the containers also introduce some contamination. For one thing, the containers may themselves have particles in them and, to prevent this, the containers need to be cleaned frequently. Typically, a detergent must be used to clean the internal surfaces of the container, the detergent being required to dislodge particles attracted to the container walls so that the particles may be flushed out. Organic molecules are also deposited on the interior surfaces of the containers used in 300 mm wafer processing. These containers are open to the machines processing the wafers with, among other things, photo-resist, and acquire deposits of organic compounds that must be cleaned with a solvent. Another form of contamination arises from outgassing of the plastic material. Organic molecules are constantly being released from the plastic and accumulate inside the closed container. These molecules deposit themselves on the wafers, further contaminating them.

To accomplish both types of cleaning has required separate washing facilities, for introducing both the detergent and the solvent. The use of the plastic container, though providing advantages, also exacts penalties in higher cost and increased manufacturing time. Accordingly, there is a need for a method and apparatus for reducing contamination in a plastic container that reduces or eliminates these penalties.

SUMMARY OF THE INVENTION

The method and apparatus for reducing contamination in a plastic container of the present invention solves the aforementioned problems and meets the aforementioned needs by providing a coating for selected surfaces of the plastic container, the coating preferably including titanium dioxide. Such a coating serves two functions. First, it causes the surface of the plastic container to wet more easily and, therefore, a detergent is no longer necessary for removing particles therefrom. Second, the coating reacts with the organic molecules emitted from the plastic so as to render them harmless to the contents stored inside the container. This eliminates the need for cleaning the contents with a solvent.

Therefore, it is a principal object of the present invention to provide a novel and improved method and apparatus for reducing contamination in a plastic container.

It is another object of the present invention to provide a method and apparatus for reducing contamination in a plastic container that reduces cost.

It is still another object of the present invention to provide a method and apparatus for reducing contamination in a plastic container that decreases manufacturing time.

The foregoing and other objects, features and advantages of the present invention will be more readily understood upon consideration of the following detailed description of the invention, taken in conjunction with the following drawings.

DETAILED DESCRIPTION OF A PREFERRED EMBODIMENT

Referring to the Figure, a container 12 is preferably adapted for holding a plurality of semiconductor wafers 16 for storage or transport of the wafers. The invention is particularly adapted for use in semiconductor fabrication and to reduce the contamination of the wafers 16; however, the invention may be employed as well for the reduction of contamination of other articles used for other purposes.

The container has a body 18 and a closeable lid 20 adapted for sealing the wafers inside the container from the external atmosphere. The container is formed of a plastic material, typically polypropylene or polycarbonate. One characteristic of the plastic material that is pertinent to the present invention is that it releases organic molecules. Another characteristic of the plastic material that is pertinent to the present invention is that it is hydrophobic, so that a detergent is better able to remove any dust particles that have been attracted or attached to the surface of the plastic material than is water alone. For purposes herein, a "plastic material" is any material having one or both of these characteristics.

Figure 1:
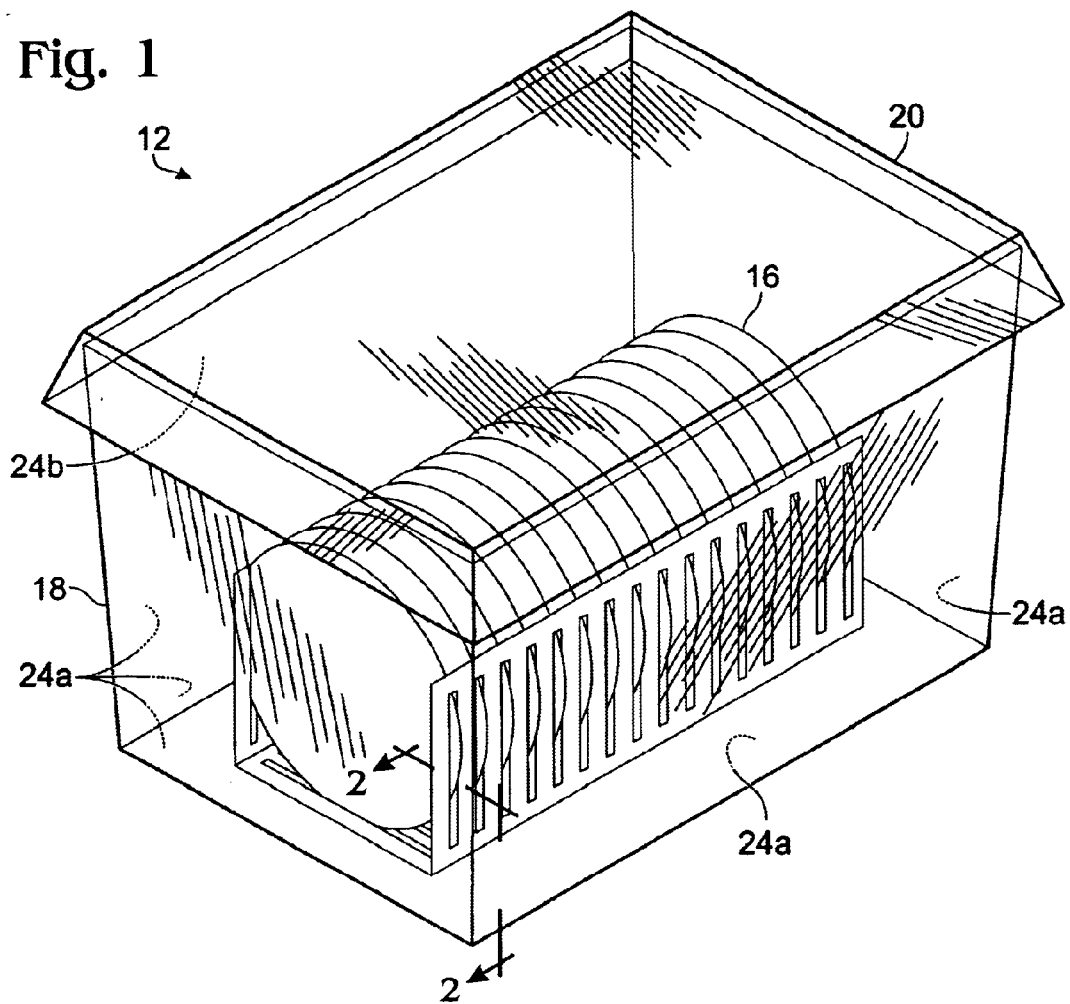
FIG. 1 is a pictorial view of a plastic container for use with the present invention.
Figure 2:
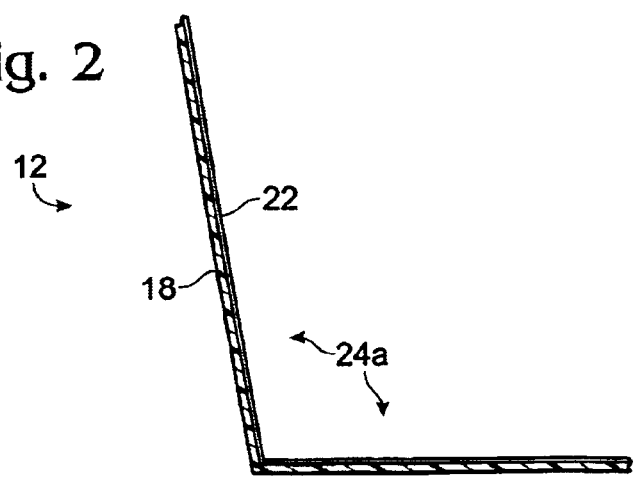
FIG. 2 is a partial, section view of the container of FIG. 1, taken along a line 2—2 thereof, showing a coating according to the present invention.

Referring to FIG. 2, according to the invention, a coating 22 is provided on selected surfaces of the plastic container 12. The relative thickness of the coating with respect to the plastic material forming the container 12 is shown highly exaggerated for illustration purposes only. The coating is adapted to reduce contamination inside the container 12 as discussed below. Referring back to FIG. 1, preferably, at least the entire interior 24 of the container 12, including the interior 24a of the body 18 and the bottom 24b of the closeable lid 20, are covered with the coating. Reducing the surface area that is provided with the coating will reduce the reduction of contamination in proportion.

Preferably, the coating 22 includes titanium dioxide and serves two functions. First, it is has been found to provide a surface that wets more easily than the plastic material (i.e., it is relatively "hydrophilic"). Therefore, water alone may be effective to loosen particulate contamination that is attracted or attached to the coating, and the container may be cleaned simply by rinsing it or by dipping it in a bath, rather than washing it in a detergent.

It is believed that titanium dioxide provides a hydrophlic coating 22 by reacting, from the energy provided by ambient ultraviolet light, with the hydroxyl ion $OH^-$ that is naturally present in atmospheric water vapor. This is believed to form a modified coating structure that includes hydroxyl groups for attracting water molecules. However, the coating may alternatively or in addition include one or more other chemicals, compositions or materials that are relatively hydrophilic without departing from the principles of the invention.

It is also believed that the modified coating structure is a photocatalyst for a further reaction with organic molecules, such as butylated hydroxytolune (BHT) and tetrahydrofut (THF), released from the plastic material. Particularly, it is believed that, from the energy provided by ambient ultraviolet light, the organic molecules give up electrons to the hydroxyl groups, and decompose into $CO_2$ and $H_2$ molecules that are harmless to the semiconductor wafers stored inside the container.

Such organic molecules are also deposited on the interior surfaces of the container, as well as other organic molecules produced by applying photo-resist to the wafers removable from the container. The latter source of organic molecules has become important as a result of moving to 300 mm wafer processing, wherein the lid of the container is opened and remains open to a wafer processing machine during the time of processing, such as during the time photo-resist is being applied. The same reaction described above is believed to alleviate the need for cleaning the container with a solvent.

So far as is known, titanium dioxide is unique in providing for both of these functions. It may be obtained in a gel form from Photocatalytic Materials, Inc., 400 Iwasaki, Kamaki city, Aichi Pref., Japan. The concentration is about 3%. To produce the coating 22, the container 12 is preferably dip coated in the gel. It has been found that the duration and temperature of the dipping are not critical. Coating thickness may vary depending on the speed with which the container is removed from the "bath," where a higher speed of removal results in a coating of lesser thickness. See Taoda, et al., U.S. Pat. No. 5,562,820, incorporated by reference herein in its entirety, for a general indication of methods for applying a gel to produce a coating.

It is to be recognized that, while a particular method and apparatus for reducing contamination in a plastic container has been shown and described as preferred, other configurations and methods could be utilized, in addition to those already mentioned, without departing from the principles of the invention.

The terms and expressions which have been employed in the foregoing specification are used therein as terms of description and not of limitation, and there is no intention of the use of such terms and expressions of excluding equivalents of the features shown and described or portions thereof, it being recognized that the scope of the invention is defined and limited only by the claims which follow.

What is claimed is:

1. An apparatus for reducing contamination of an article, comprising a plastic container adapted for holding the article, and a coating on selected portions of said container, said coating consisting essentially of titanium dioxide such that the titanium dioxide is not substantially prevented from attracting atmospheric water molecules for loosening particle contamination, for facilitating cleaning the container to prevent contamination of the article when the article is stored in the container, the apparatus further comprising at least one semiconductor wafer disposed in the container.

2. The apparatus of claim 1, wherein said container includes a closeable lid for substantially sealing the interior of the container from the external atmosphere.

3. The apparatus of claim 2, wherein said container includes polypropylene.

4. The apparatus of claim 2, wherein said container includes polycarbonate.

5. The apparatus of claim 1, wherein said selected portions are interior surfaces of the container.

6. The apparatus of claim 1, wherein said coating is provided in the form of a gel.

* * * * *